United States Patent
Suematsu

[11] 4,054,363
[45] Oct. 18, 1977

[54] MULTI-HETERO-STRUCTURE WAVEGUIDE TYPE OPTICAL INTEGRATED CIRCUITRY

[75] Inventor: Yasuharu Suematsu, Kawasaki, Japan

[73] Assignee: Tokyo Institute of Technology, Tokyo, Japan

[21] Appl. No.: 640,922

[22] Filed: Dec. 15, 1975

[51] Int. Cl.$^2$ .................. G02B 5/14; H01S 3/00
[52] U.S. Cl. .................. 350/96 WG; 29/576 R; 331/94.5 H; 350/96 C; 357/18
[58] Field of Search .................. 350/96 WG, 96 C; 331/94.5 H; 357/18

[56] References Cited
U.S. PATENT DOCUMENTS 3,790,902  2/1974  Miller .................. 350/96 WG
3,902,133  8/1975  Watts .................. 350/96 WG

OTHER PUBLICATIONS

Burnham et al. "Low Divergence Beams from Grating Coupled Guide..." Appl. Phys. Letters, vol. 26, No. 1, 1 June, 1975.

*Primary Examiner*—John K. Corbin
*Assistant Examiner*—Stewart Levy
*Attorney, Agent, or Firm*—Burgess, Ryan and Wayne

[57] ABSTRACT

A multi-hetero-structure waveguide type optical integrated circuit is provided wherein a thin-film element such as a semiconductor laser is coupled through a directional coupler to a waveguide having a small transmission loss.

13 Claims, 23 Drawing Figures

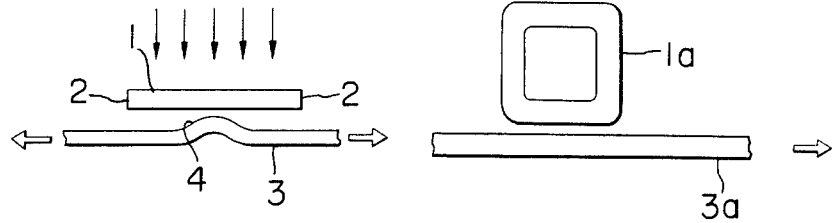
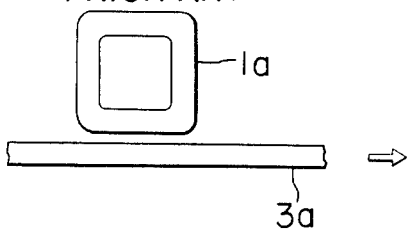
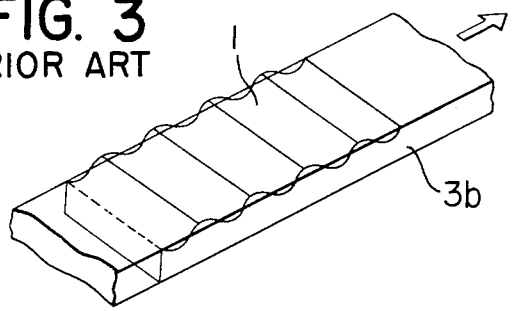
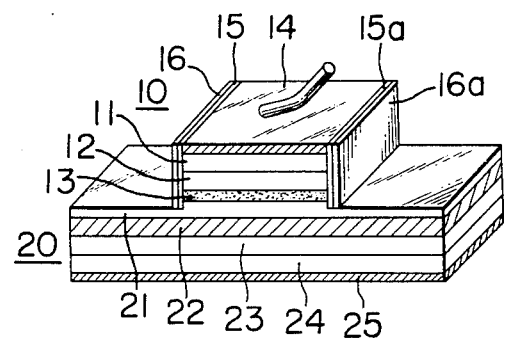
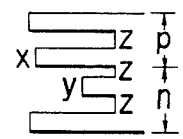
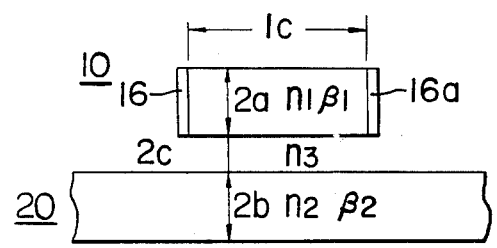

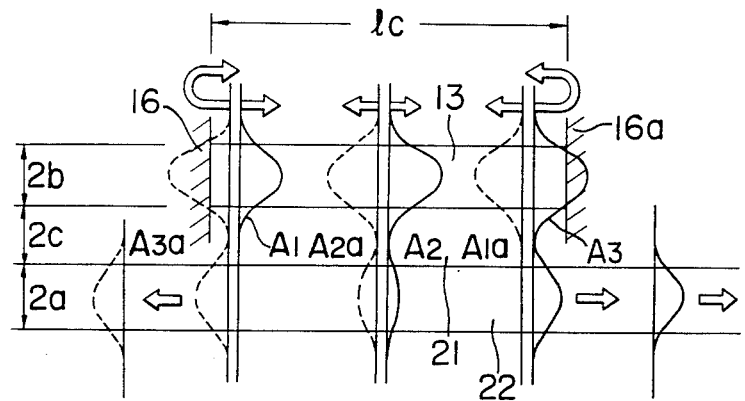
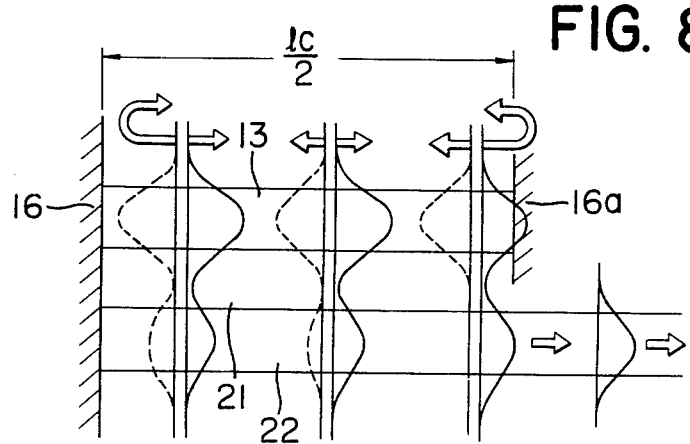
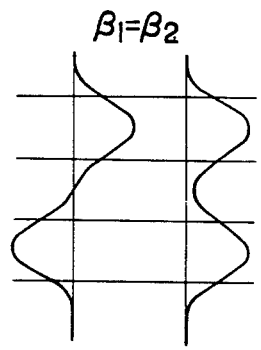
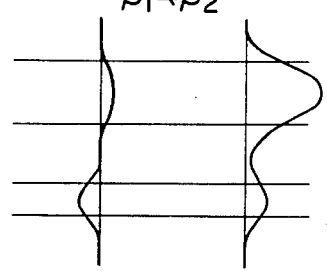

MULTI-HETERO-STRUCTURE WAVEGUIDE TYPE OPTICAL INTEGRATED CIRCUITRY

BACKGROUND OF THE INVENTION

The present invention relates to a multi-hetero-structure waveguide type optical circuit in which various functional circuits are formed upon a wafer by coupling thin-film elements through directional couplers to a waveguide.

In the description of the present invention, the relationship between the prior art active and passive optical elements and a waveguide will be first described. For this purpose, the relationship between a semiconductor laser and a waveguide will be explained.

In the conventional semiconductor laser, a reflector is attached to each end of a laser medium so that the semiconductor laser may function as a resonator. It has been very difficult to attach a waveguide to the resonator for deriving part of the laser light through the reflector. It has been proposed to use a directional coupler to couple a waveguide to a ring resonator type semiconductor laser. However, the attachment of the waveguide is still difficult because part of the laser light is derived. Furthermore, they cannot be fabricated in the form of an integrated circuit. It has been also proposed to use a distribution reflector which is attached to a portion of a thin-film semiconductor laser and formed integral with a waveguide. However, the transmission loss in the waveguide is very large at the wavelength of the laser light because the thin-film waveguide has the same composition as that of the semiconductor laser medium. There is also a drawback in that the output light diverges because the thickness of the thin-film laser medium is made very small in order to reduce the oscillation threshold current. Furthermore, in order to integrate the device with other optical elements, individually fabricated optical elements are required. Moreover, the coupling loss is induced when the optical elements are coupled, and the operation life is short because the crystals are grown over the distribution reflector after the latter has been finished.

SUMMARY OF THE INVENTION

One of the objects of the present invention is therefore to provide a multi-hetero-structure waveguide type optical integrated circuit wherein a thin-film element such as a semiconductor laser is coupled through a directional coupler to a waveguide which has the minimal transmission loss.

Another object of the present invention is to provide a multi-hetero-structure optical integrated circuit in which mesa type thin-film elements are formed integral with a multi-hetero-structure waveguide and coupled thereto through a directional coupler so that laser oscillators, modulators, amplifiers, detectors or demodulators, spatial modulators and so on may be simultaneously formed by growing crystals.

A further object of the present invention is to provide a multi-hetero-structure waveguide type optical integrated circuit wherein mode-transformation input and output circuits, thin-film lenses which are not directly related with the operation life of thin-film elements are fabricated in the form of an integrated circuit so that the optical integrated circuit may be made more compact, and more efficient with the minimum loss as compared with the prior art optical integrated circuits.

The above and other ends of the present invention are attained by a multi-hetero-structure waveguide type optical integrated circuit in which a mesa type, thin-film oscillator consisting of active and/or passive optical elements is formed integral with a waveguide in which the transmission loss at the wavelength of the laser light to be transmitted is less, and is coupled thereto through a directional coupler.

BRIEF DESCRIPTION OF THE DRAWING

FIGS. 1, 2 and 3 are schematic views used for the explanation of the prior art semiconductor laser with waveguide;

FIG. 4 is a perspective veiw of a first embodiment of the present invention;

FIG. 5 is a view showing the relationship among the indexes of refraction of the layers of the device shown in FIG. 4;

FIG. 6 is a schematic view of the device show in FIG. 4;

FIGS. 7 and 8 are views used for the explanation of the mode of the operation of the device shown in FIG. 4;

FIGS. 9(a) and (b) are views used for the explanation of the relationship between the propagation constants and waveforms;

DESCRIPTION OF THE PREFERRED EMBODIMENTS

Figure 10:
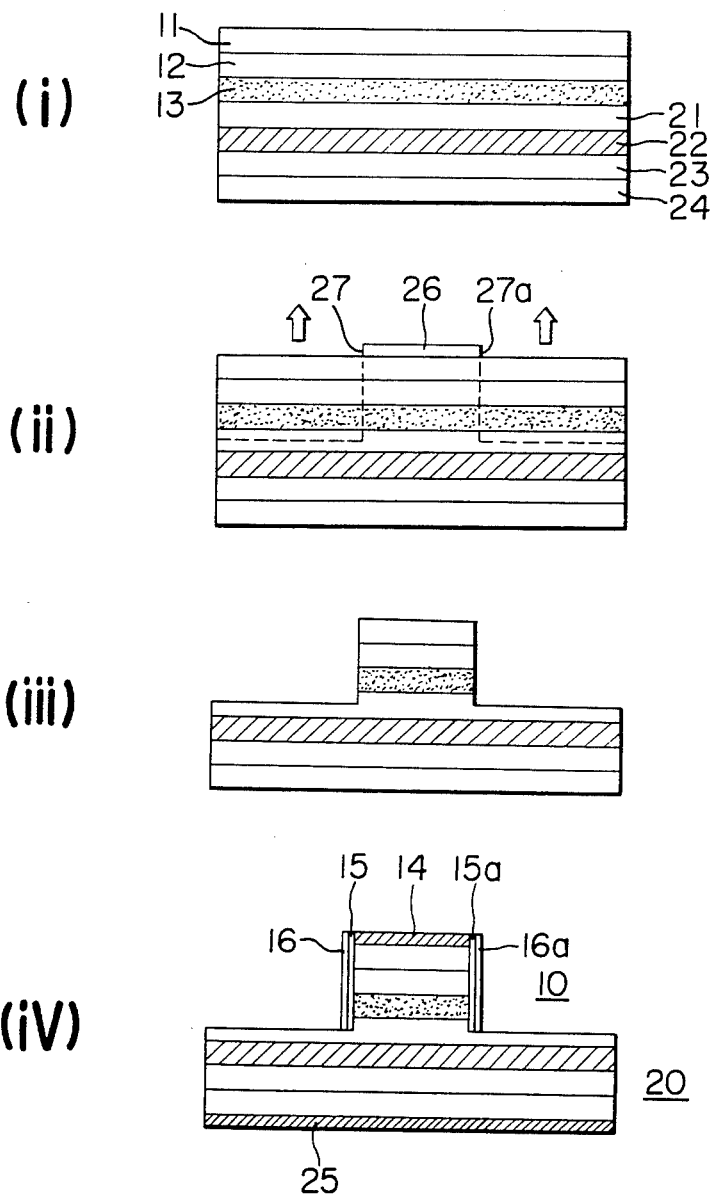
FIG. 10 shows the steps for fabricating the device shown in FIG. 4.

Prior Art, FIGS. 1, 2 and 3

In FIG. 1 there is schematically shown one example of the prior art laser output circuits. A coupler 4 of a waveguide 3 made of a dielectric material is placed below a semiconductor laser 1 with the reflecting mirror ends 2 so that part of the laser light produced in the laser 1 may be transmitted into the waveguide 3. However, the attachment of the partially curved waveguide is difficult.

In another prior art arrangement shown in FIG. 2, part of the laser beam produced by a ring resonator type semiconductor laser 1a is derived through a directional coupler 3a, but the attachment of the low loss waveguide is also difficult because higher fabrication technique is required.

In a further prior art arrangement shown in FIG. 3, a distribution reflector 3b is attached to one portion of a thin-film semiconductor laser 1, but the loss at the wavelength of the laser light is great because the waveguide is the thin-film with the same composition with that of the lase . Furthermore, the thin-film laser is made very thin in order to decrease the oscillation threshold current so that there arises a drawback that the output light is diverged. A further drawback is that, in order to integrate with other optical elements, individually fabricated optical elements are required. There is also a drawback in that the coupling loss is induced between light elements. The crystal must be grown over the distribution reflector 3b after it has been fabricated so that there arises the problem that the operation life is short.

The Invention, First Embodiment, FIGS. 4 through 10

In FIG. 4 there is shown the first embodiment of the present invention comprising an oscillator 10 and a waveguide 20. The oscillator 10 consists of a GaAs layer 11, $Al_zGa_{1-z}As$ layer 12, an active layer 13 consisting of $Al_xGa_{1-x}As$, a first electrode 14 and reflecting mirror ends 16 and 16a with transparent insulating layers 15 and 15a interposed between the mirror ends 16 and 16a and the layers 11 through 13. The waveguide 20 comprises an $Al_zG_{1-z}As$ layer 21 which is a coupling layer for coupling between the oscillator 10 and the waveguide 20, an $Al_yGa_{1-y}As$ layer 22 which is an output waveguide, an $Al_zGa_{1-z}As$ layer 23, a GaAs layer 24 and an electrode 25. The subscripts $x$, $y$ and $z$ have the following relation:

$$x < y < z$$

The indexes of refraction of the layers are shown in FIG. 5, and $p$ and $n$ denote the types of semiconductor.

Next the mode of operation will be described with reference to FIG. 6 which is a schematic view of the device shown in FIG. 4 and FIG. 7 showing how part of the laser light is derived from the oscillator 10 into the waveguide 20. The coupling length $l_c$ depends upon the thickness 2a, 2b and 2c and indexes of refraction $n_1$, $n_2$ and $n_3$ of the active layer 13, the output waveguide layer 22 and the coupling layer 21. $\beta_1$, $\beta_2$ and $\beta_3$ are propagation constants.

The laser wave $A_1$ with the coupling length $l_c$ produced at one end of the oscillator 10 propagates in the direction indicated by the solid-line arrow, and gradually changes into the laser wave $A_2$. Part of the laser wave propagates into the waveguide 20 as the laser wave $A_3$ which is transmitted therethrough as the output. Within the oscillator 10, the laser wave is reflected by the reflecting mirror 16a into the laser waveform $A_{1a}$ indicated by the broken lines. The laser wave $A_{1a}$ changes into the laser wave $A_{2a}$, part of which is propagated into the waveguide 20. The laser wave $A_{3a}$ is reflected at the reflecting mirror 16 to form the laser wave $A_1$ again indicated by the solid line. In this case, the laser wave in the waveguide 20 becomes the outgoing output.

The mode of output of laser wave when the coupling length is $l_c/2$ is shown in FIG. 8. When $\beta_1 = \beta_2$ and $\beta_1 \neq \beta_2$ the laser waves are shown as the superposition of two waves as shown in FIGS. 9(a) and 9(b).

As described above, the thin-film oscillator consisting of laser media and the thin-film output circuit consisting of thin films having a small loss at the laser wavelength may be fabricated in the form of a multi-layered structure.

Next the method for fabrication of the device shown in FIG. 4 will be described.

In the device shown in FIG. 4, the ends 16 of the oscillator 10 upon which are formed the reflecting mirrors 16 cannot be cleaved or finished by polishing. One example of the fabrication method in accordance with the present invention which may overcome this problem will be described with reference to FIG. 10.

Upon the wafer consisting of, as shown in FIG. 10(i) the GaAs layer 11, $Al_zGa_{1-z}As$ layer 12, $Al_xGa_{1-x}As$ layer 13, $Al_zGa_{1-z}As$ layer 21, $Al_yGa_{1-y}As$ layer 22, $Al_zGa_{1-z}As$ layer 23 and GaAs layer 24 is placed a mask 26 as shown in FIG. 10(ii). The mask 26 consists of a GaAs crystal whose both ends 27 and 27a are cleaved to form mirror surfaces. The mask 26 is placed upon the layer 11 in such a way that their crystal surfaces may coincide with each other. Thereafter, the wafer is subjected to the reverse sputtering so that the portions encircled by the broken lines may be removed. Thus, the mesa type oscillator 10 may be formed as shown in FIG. 10(iii). The end surfaces of the oscillator 10 are finished to have the mirror surfaces as with the end surfaces 27 and 27a of the mask 26. Thereafter, as shown in FIG. 10(iv), the electrodes 14 and 25 are attached, the transparent insulating layers 15 and 15a are attached to the end surfaces of the oscillator 10 and then the reflecting mirrors 16 and 16a are attached on the transparent insulating layers 15 and 15a. Thus, the multi-hetero-structure waveguide type optical integrated circuit may be obtained. According to the experiments, it was found out that the mirror surfaces may be obtained on the <110> surface of $Al_xGa_{1-x}As$ by the above method, and thus obtained mirror surfaces permit the laser action.

Figure 11:
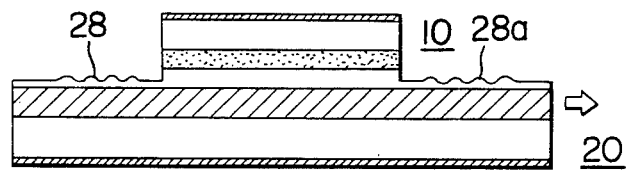
FIGS. 11 through 22 are schematic views of second to tenth embodiments of the present invention.
Figure 12:
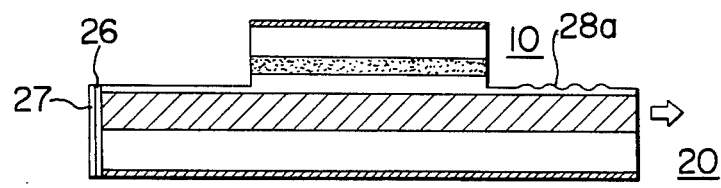
Figure 13:
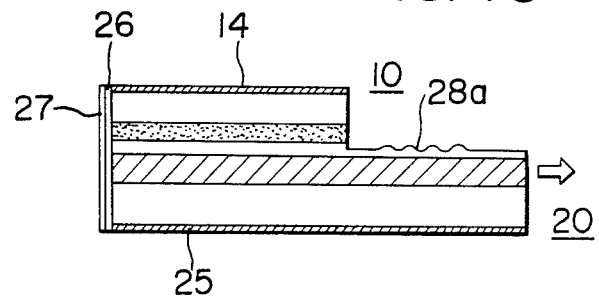

Further embodiments in accordance with the present invention are shown in FIGS. 11, 12 and 13. In the device shown in FIG. 11, the oscillator 10 is not provided with the reflecting mirror ends, but distribution type reflectors 28 and 28a are attached upon the upper surface of the output circuit 20. In the device shown in FIG. 12, instead of the distribution type reflectors 28, a reflecting mirror 27 is attached to the output circuit 20 with a transparent insulating layer 26 interposed therebetween. In the device shown in FIG. 13, the reflecting mirror 27 is formed integral with the oscillator 10. In these embodiments, the width of the waveguide layer consisting of $Al_yGa_{1-y}As$ of the output circuit has been shown as being equal to that of the wafer, but it is to be understood that this width may be arbitarily selected.

Figure 14:
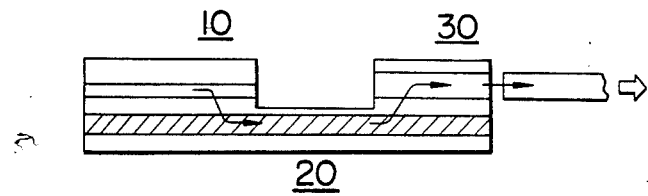
Figure 15:
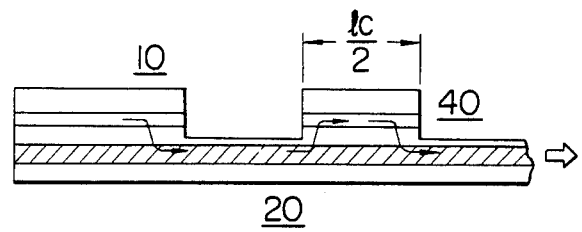

In the fifth embodiment shown in FIG. 14, an output circuit 30 is associated with the device shown in FIG. 4. The oscillator 10 and the waveguide 20 is formed in a unitary construction, and thereafter a thin-film mode transformation output circuit 30 is formed on the waveguide 20 and direction-coupled thereto. The laser light from the oscillator 10 is transmitted through the waveguide 20 to the output circuit 30, from which the laser light is transmitted through an optical fiber transmission line 70 to a destination.

In the sixth embodiment shown in FIG. 5, an amplifier 40 and the oscillator 10 are integrated by reverse sputtering the wafer shown in FIG. 10(i) to simultaneously form the oscillator 10 and the amplifier 40. Therefore, the laser active layers of the oscillator 10 and the amplifier 40 have the same composition so that the excellent amplifier 40 may be provided.

Figure 16:
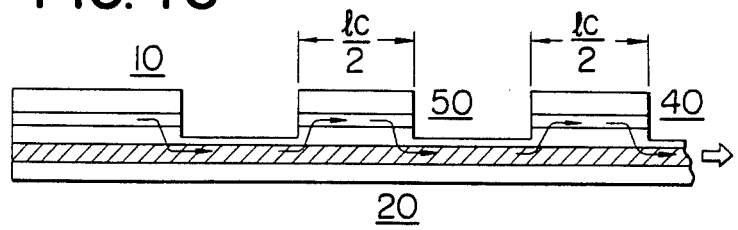

The seventh embodiment shown in FIG. 16 further includes a modulator 50 formed integral with the oscillator 10 and the amplifier 40 on the waveguide 20.

Figure 17:
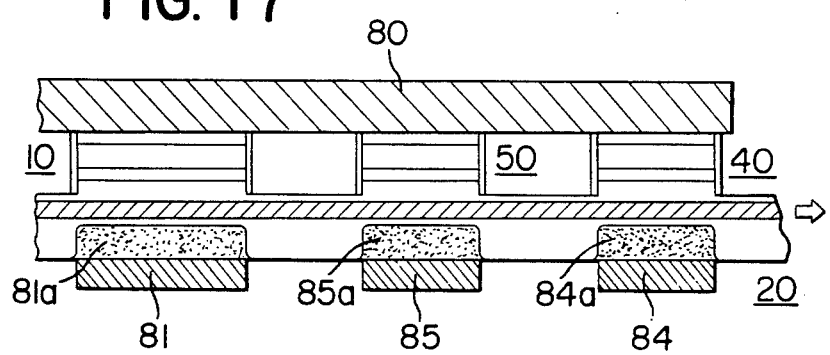

FIG. 17 shows in detail the device shown in FIG. 16. 80 is an upper electrode which also functions as a heat sink; and 81, 84 and 85 are lower electrodes attached or formed on the lower surface of the waveguide 20 for the oscillator 10, the amplifier 40 and the modulator 50, respectively. 81a, 84a and 85a are low resistance regions formed in the vicinity of the lower electrodes 81, 84 and 85 by the diffusion of impurities.

Figure 18:
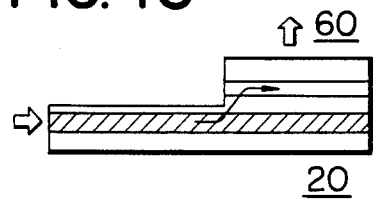

In the eighth embodiment shown in FIG. 18, a detector or demodulator 60 is formed integral with the waveguide 20. Opposed to the above embodiments, only the passive optical elements are formed on the waveguide 20, this device is adapted to be used for detection or demodulation or monitoring.

Figure 19:
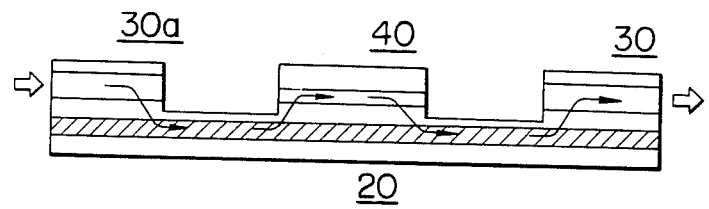

In the ninth embodiment shown in FIG. 19, the amplifier 40 is first formed integral with the waveguide 20 and then an input circuit 30a and the output circuit 30 are formed.

Figure 20:
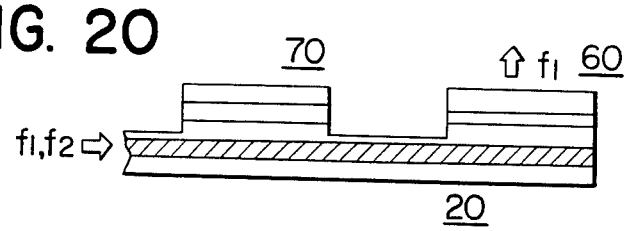

In the tenth embodiment shown in FIG. 20, a filter 70 is incorporated in the device shown in FIG. 18. When the laser lights with the frequencies $f_1$ and $f_2$ are transmitted through the waveguide 20, the filter 70 cuts off the laser light with the frequency $f_2$ so that the laser light of the frequency $f_1$ may be detected by the detector 60.

Figure 21:
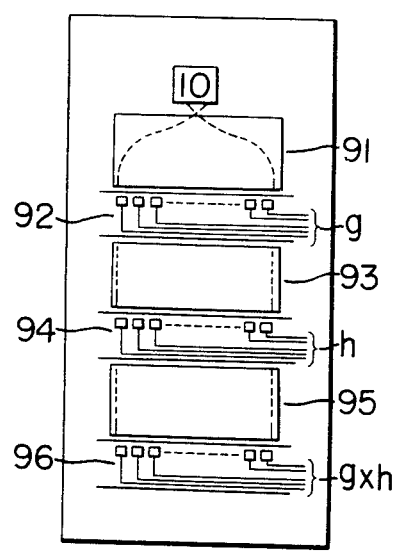

In FIG. 21 there is shown an arithematic circuit in accordance with the present invention utilizing the space Fourier transformation. The laser light from the oscillator 10 is transmitted through a thin-film lens 91 into a space modulator 92 and is modulated with the signal $g$. The modulated laser light is transmitted through a thin-film lens 93 into a space modulator 94 and is modulated with the signal $h$. Thus modulated signal is transmitted through a thin-film lens 95 into a detector bank 96 so that ($g \times h$) outputs may be derived. According to the present invention, these circuit components may be formed as an integrated circuitry.

Figure 22:
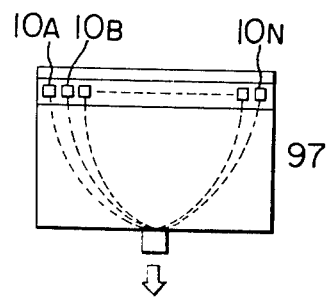

In the device shown in FIG. 22, a number of N oscillators 10A, 10B, . . . , and 10N oscillators are formed in parallel so that the outputs therefrom may be added through a thin-film lens 97 to provide the high output.

In the above embodiments, GaAs semiconductor lasers are used, but any suitable hetero-structure diode lasers such as InGaAs, AlGaAsSb, InGaAsP and so on may be used.

What is claimed is:

1. A multi-hetero-structure waveguide type optical integrated circuit, comprising mesa type thin film oscillator passive or active elements, a directional coupler, a multi-hetero-structure waveguide having a small loss at the wavelength of the laser light to be transmitted, said oscillator being integrally formed through said directional coupler upon said waveguide, and a thin-film mode-matching output circuit formed integral of the waveguide upon the upper surface thereof and direction-coupled thereto.

2. A multi-hetero-structure waveguide type optical integrated circuit, comprising mesa type thin film oscillator passive or active elements, a directional coupler, a multi-hetero-structure waveguide having a small loss at the wavelength of the laser light to be transmitted, said oscillator being integrally formed through said directional coupler upon said waveguide, and a plurality of oscillators formed upon the waveguide and arrayed in parallel in such a way that the outputs from the oscillators may be derived through a thin-film lens.

3. A multi-hetero-structure waveguide type optical integrated circuit comprising a semiconductor laser oscillator, a first thin-film lens through which is transmitted the laser light from the oscillator; a first bank of spatial modulators arrayed in parallel for modulating the laser light transmitted through the first thin-film lens; a second thin-film lens for transmitting therethrough the modulated laser light from said first spatial modulator bank; a second bank of spatial modulators arrayed in parallel for further modulating the laser light transmitted through the second thin-film lens; a third thin-film lens for transmitting therethrough the laser light from said second spatial modulator bank; and a bank of detectors arrayed in parallel for detecting or demodulating the modulated light transmitted through the third thin-film lens.

4. A multi-hetero-structure waveguide type optical integrated circuit, comprising mesa type thin film oscillator passive or active elements, a directional coupler, a multi-hetero-structure waveguide having a small loss at the wavelength of the laser light to be transmitted, said oscillator being integrally formed through said directional coupler upon said waveguide, and an amplifier formed integral with the waveguide on an upper surface thereof.

5. An optical integrated circuit as set forth in claim 4 wherein a modulator is formed integral with the waveguide upon the upper surface thereof.

6. An optical integrated circuit as set forth in claim 5 wherein a detector or demodulator is formed integral with the waveguide upon the upper surface thereof.

7. An optical integrated circuit as set forth in claim 6 wherein a filter is further formed integral with the waveguide upon the upper surface thereof.

8. A multi-hetero-structure waveguide type optical integrated circuit, comprising a mesa type thin-film oscillator comprising passive or active optical elements, a directional coupler, a multi-hetero-structure waveguide having a small loss at the wavelength of the laser light to be transmitted, said oscillator being integrally formed through said directional coupler upon said waveguide, and a distribution type reflector integrally formed with the waveguide on the upper surface thereof.

9. An optical integrated circuit as set forth in claim 8, further comprising the reflecting mirror formed on the waveguide.

10. An optical integrated circuit set forth in claim 8, wherein a mirror reflector is formed integral both with the oscillator and with the waveguide.

11. An optical integrated circuit as set forth in claim 8 wherein said oscillator consists of a GaAs layer, an $Al_zGa_{1-z}As$ layer, an active layer consisting of $Al_x Ga_{1-x}$, an electrode attached to the GaAs layer, and reflecting mirrors formed through insulating layers on the end surfaces of the oscillator.

12. An optical integrated circuit as set forth in claim 8 wherein said directional coupler consists of an $Al_zGa_{1-z}As$ layer, AlGaAsSb layer or InGaAs layer.

13. An optical integrated circuit as set forth in claim 8 wherein said waveguide consists of a coupling layer consisting of $Al_zGa_{1-z}As$ layer for coupling between the oscillator and the waveguide, an output waveguide layer consisting of $Al_yGa_{1-y}As$ layer, a GaAs layer and a second electrode attached on the GaAs layer.

* * * * *